United States Patent [19]

Frost et al.

[11] Patent Number: 4,795,977
[45] Date of Patent: Jan. 3, 1989

[54] INTERFACE SYSTEM FOR INTERFACING A DEVICE TESTER TO A DEVICE UNDER TEST

[75] Inventors: Keith A. Frost, Redding; Timothy Harns, Palo Cedro; Ronald D. Simmons, Redding, all of Calif.

[73] Assignee: Pacific Western Systems, Inc., Mountain View, Calif.

[21] Appl. No.: 27,721

[22] Filed: Mar. 19, 1987

[51] Int. Cl.⁴ .................. G01R 31/02; G01R 1/06
[52] U.S. Cl. ...................... 324/158 F; 324/73 PC; 324/158 P
[58] Field of Search ............ 324/158 F, 158 P, 72.5, 324/73 PC

[56] References Cited

U.S. PATENT DOCUMENTS

| | | | |
|---|---|---|---|
| 4,567,432 | 1/1986 | Buol et al. | 324/158 P |
| 4,686,463 | 8/1987 | Logan | 324/158 P |
| 4,697,143 | 9/1987 | Lockwood et al. | 324/158 P |

*Primary Examiner*—Ernest F. Karlsen
*Attorney, Agent, or Firm*—Harry E. Aine

[57] ABSTRACT

A device tester, such as a memory tester, is electrically interfaced to a device under test, such as a memory die, by means of an improved interface system. The interface system includes an array of coaxial cables for making electrical connection to the test circuits of the device tester by means of coaxial connections at the tester ends. The coaxial cables are fitted at their other ends with slidable two-conductor connector receptacles which make connections to fixed male pins of spring loaded feedthrough connectors passing through a mother board. The spring loaced pins of the feedthroughs make electrical contact to eyelets terminals of strip-line circuits on a probe card (daughter board) terminating on an array of flexible probes for probing the memory die under test. As an alternative, the eyelet terminals of the daughter board are connected to sockets to receive the device under test. The electrical circuits of the interface system, including connectors, are dimensioned for impedance maching to reduce unwanted reflection of test signasl to extend the test frequency response up to the 1 to 2 GHz range.

5 Claims, 1 Drawing Sheet

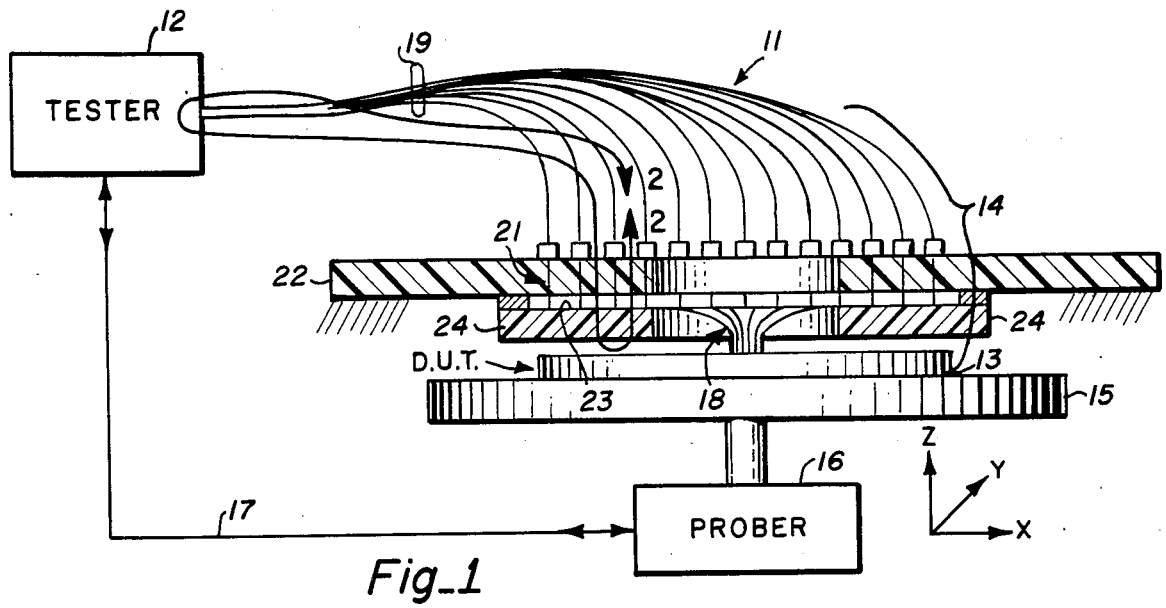
Fig_1
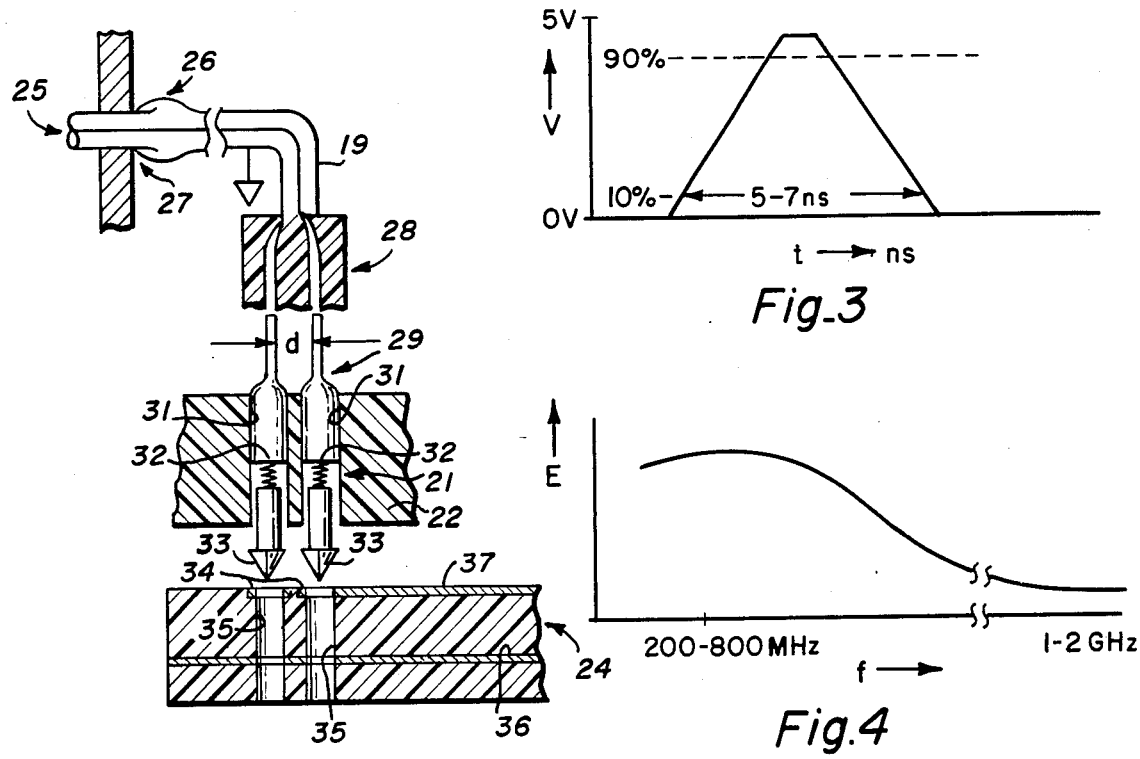
Fig_2
Fig_3
Fig_4

INTERFACE SYSTEM FOR INTERFACING A DEVICE TESTER TO A DEVICE UNDER TEST

BACKGROUND OF THE INVENTION

The present invention relates in general to an improved interface system for interfacing a device tester to a device under test.

DESCRIPTION OF THE PRIOR ART

Heretofore, interface systems have been employed for interfacing a device tester to a device under test. In one such interface system, individual test circuits of the device tester were interconnected to individual ones of the devices under test by a series connection of a coaxial cable, connected at one end to the tester circuit, and at the other end via a soldered connection to ground and to a finger of a spring-loaded edge connector assembly. The finger of the edge connector, which was connected to the center conductor of the coaxial cable, made electrical contact to a pad on the edge of a printed circuit probe card. That is, the probe card included an array of printed strip-line circuits on one side, each connected to a spring biased probe for electrically probing a pad on a device under test. The other side of the probe card included a ground plane conductor connected to a grounded flexible contact of the edge connector. A problem encountered with this prior art interface system was that the edge connector, especially its solder connections, introduced substantial lump inductance and capacitance into the interface circuit which served to operate like a low-pass filter above 200 MHz, thereby substantially degrading the test signal and test-response signal for test-pulse repetition rates at and above 25 MHz. More particularly, it resulted in the loss of test capability for frequency components above 200 MHz which resulted in loss of test and response pulse definition, particularly for frequency components in the range of 200 MHz to 2 GHz.

It would be desirable if an interface system could be devised which would allow testing of frequency components upto the 1 to 2 GHz frequency range.

SUMMARY OF THE PRESENT INVENTION

The principal object of the present invention is the provision of an improved interface system for interfacing a tester to a device under test.

In one feature of the present invention, electrical circuits on a probe card (daughter board) are connected to an array of coaxial cables via the intermediary of an array of spring loaded impedance matched connectors passing through a circuit board (mother board) mounted proximate the device under test, whereby reflection of test signal energy from the feedthrough connectors is reduced in use and the frequency response extended to a higher frequency regime.

In another feature of the present invention, the coaxial cables are connected to fixed prong portions of the spring loaded feedthrough connectors by means of two-pin slidable connectors affixed to the ends of the coaxial cables, whereby reflection of test signal energy fro the transition from coaxial cable to feedthrough connector is reduced in use.

In another feature of the present invention, the conductors of the spring loaded feedthrough connector pairs are spaced apart by a certain distance for impedance matching the coaxial cables to the strip line circuits on the probe card, whereby reflection of test signal energy from the feedthrough connector is reduced in use.

Other features and advantages of the present invention will become apparent upon a perusal of the following specification taken in connection with the accompanying drawings wherein:

BBRIEF DESCRIPTION OF THE DRAWINGS

FIG. 1 is a schematic circuit diagram, partly in block diagram form, of a device tester employing an interface system of the present invention, FIG. 2 is an enlarged, cross-sectional and foreshortened view of a protion of the structure of FIG. 1 delineated by line 2—2, FIG. 3 is a voltage waveform of a typical test pulse response obtained over the interface system of the present invention, and FIG. 4 is a plot of the amplitude of Fourier components of a test signal derived over the interface system of the present invention.

DESCRIPTION OF THE PREFERRED EMBODIMENTS

Referring now to FIG. 1, there is shown a device testing system 11 incorporating features of the present invention. The test system 11 includes a tester 12, such as a COLT III Memory Tester, commercially available from Pacific Western Systems, Inc. of Mountain View, Calif. The prober 16, under the control of the tester 12 via cable 17, translates the test wafer 13 sequentially in the x and y directions to bring selected die of the wafer into registration under an array of spring biased test probes 18 arranged in a certain pattern for engaging a certain test pad pattern, on the respective die of the wafer, with the tips of the probes 18. Then, the prober 16 is actuated in the z direction to raise the selected test die into electrical contact with the tips of the probes 18.

Electrical test signals originating in test circuits of the tester 12 are transmitted to and response test signals are received in the tester 12 from the test die over the interface system 14 which is described in greater detail below with reference to FIG. 2. Briefly, the interface system 14 includes an array of coaxial cables 19 connected at one end to test circuits of the tester 12 and at the other ends to feedthrough connectors 21 passing through a mother board 22 and connecting via spring biased pins to strip-line circuits 23 on a probe card 24 (daughter board). The strip-line circuits terminate on respective probes 18. A memory tester system of the type shown in FIG. 1 is disclosed in U.S. Pat. Nos. 4,460,999; 4,460,997 and 4,500,836, the disclosures of which are hereby incorporated by reference in their entirety.

Referring now to FIG. 2, there is shown the tester to device under test interface system 14 incorporating features of the present invention. More particularly, each coaxial cabee 19 is connected to a respective tester circuit 25 by means of a female coaxial connector portion 26 carried at the tester end of the coaxial cable 19 and coupled to a male coaxial connector portion 27 carried from the tester 12. A suitable coaxial connector is part No. 201511-1, commercially available from AMP Corporation for connection onto the end of a microcoaxial cable 19.

The outer conductor of the coaxial cable 19 is connected to ground to form a ground shield for the center conductor. The other end of the coaxial line 19 is terminated in a one-by-one two-conductor receptacle connector 28 for slidably mating with a pair of fixed male connector pins 29 of the spring loaded feddthrough connector 21 passing through the mother board 22. A suitable coaxial cable assembly including the coaxial connector 26 at one end and the one-by-one connector at the other end is one commercially available from AMP Corporation as part No. 6-931443-448 having a characteristic impedance of 75 Ω.

The spring loaded feedthrough connector 21 includes the male two-pin connector portion 29 for slidably mating with the female two-conductor receptacle portion of the slidable connector 28. The male pin connector portion 29 includes a hollow, tubular portion 31 which slidably receives therein a spring loaded pin 32 having a chisel-shaped end 33.

The chisel-shaped ends 33 of spring loaded pins 32 make electrical contact to electrically conductive lip portions of eyelets 34 of bores 35 in the printed circuit probe card 24. These eyelet 34 make electrical contact to the ground plane conductor 36 and strip-liee circuits 37, respectively, of the probe card 24.

The two conductors 29, 31 and 32 of the spring loaded feedthrough connector 21 are dimensioned and spaced apart by a distance d to provide a characteristic impedance for matching the characteristic impedance of the strip-lines to the characteristic impedance of the coaxial cables 19 and connectors 28.

In a typical example, the male pin conductors 29 of the feedthrough connector 21 have a part No. R-SS100-WW and are commercially available from IDI Corporation of Kansas City, Kansas. The spring loaded pins 32 have part No. SS-8-3.8G and are commercially available from IDI Corporation. The probe card 24 is made of FR4 fiberglass having a strip-line conductor 37, as of 2 oz. tin-plated copper approximately 3 mils thick spaced from the ground plane layer 36 by approximately 19 mils, such ground plane layer 36 being made of 1 oz. copper, 1.5 mils thick.

The interface transmission lines 14 are dimensioned to provide minimum reflection of signal energy from the various transmission line transitions. More particularly, the coaxial cable 19 has a characteristic impedance of 75Ω and the connector 28 has a characteristic impedance of 70Ω. The feedthrough connector 21 has a measured characteristic impedance of 86Ω, whereas the strip-line circuits on the probe card 24 have a characteristic impedance of 84Ω. (Theoretical value nominally 87.5Ω.)

In an alternative embodiment, the probe card 24 is replaced by a daughter board having a test device socket to receive the device under test with the socket pins being iired to the eyelets 34.

In operation, the tester 12 sends a test voltage pulse to the device under test 13 over the interface system 14. In a typical example, the test pulse is as shown in FIG. 3 having a peak height of 5 V, a pulse width of 5 to 7 ns betwee 10% points and a rate of rise and fall between 10% and 90% points of 1.5 V/ns. Such a test pulse has an energy spectrum of the type shown in FIG. 4 where there are strong Fourier components in the range of 200 to 600 MHz, associated with a pulse repetition rate of 20 to 40 MHz and significant, high a frequency components upto the range of 1 to 1.2 GHz. These high frequency components are passed through the interface system 14 without excessive reflection.

An advantage of the interface system 14 of the present invention is that it allows transmission of test and response pulses between the tester and device under test without excessive signal degradation upto the 0.600 to 1.2 GHz range, thereby preserving test signal definition for pulses with repetition rates in the range of 20–40 MHz.

What is claimed is:

1. In an interface system for electrically interfacing tester circuits of a device tester to a device under test for sending test signals to and receiving response test signals from the device under test:

an array of coaxial cables, each having an inner center conductor and an outer conductor, for connection at a first end to the tester circuits of the device tester for communicating test and test response signals between the tester and the device under test;

an array of two pin conductor slidable connectors each fixedly secured to each of the second ends of said coaxial cables and having a signal terminal pin connected to said inner conductor of the coaxial cable and a ground terminal pin connected to said outer conductor of each of said coaxial cables;

a mother board for mounting proximate the device under test;

an array of spring loaded two pin conductor feedthrough connectors fixedly mounted to said mother board for feeding electrical signals through said mother board from one major face to an opposed major face;

said two pin conductor feedthrough connectors each having a pair of spaced apart movable spring loaded conductive pins protruding from one major face of said mother board and each movable pin being electrically connected to and slidably mating with a fixed conductive pin at the opposed major face, said fixed conductive pins of each of said two pin conductor feedthrough connectors being disposed for slidably mating with said pin terminals of said two pin conductor slidable connectors affixed to said second ends of said coaxial cables;

a daughter circuit board having electrical circuits formed thereon for communicating electrical test and response test signals between the tester and the device under test; and said spring loaded two pin feedthrough connectors of said mother board being disposed in a pattern to register with the electrical circuits on said daughter board for making spring loaded electrical connections between said spring loaded connectors and said electrical circuits on said daughter board.

2. The interface system of claim 1 wherein said fixed conductor portions of said two pin feedthrough connectors are male prong portions to slidably engage female receptacle portions of said two pin conductor connectors affixed to said second ends of said coaxial cables.

3. The interface system of claim 1 wherein said spring loaded conductor portions of said two pin conductor feedthrough connectors are spaced apart by a certain distance for impedance matching the characteristic impedance of said coaxial cables to the characteristic impedance of said electrical circuits of said daughter board.

4. The interface system of claim 3 wherein said electrical circuits on said daughter board are strip-line circuits.

5. The interface system of claim 4 wherein said electrical circuits on said daughter board include flexible, electrical probe portions for making electrical contact to electrical circuits on the device under test.

* * * * *